(12) United States Patent
Bae et al.

(10) Patent No.: US 10,836,151 B2
(45) Date of Patent: Nov. 17, 2020

(54) APPARATUS FOR SEPARATING A WINDOW AND METHOD FOR SEPARATING A WINDOW USING THE SAME

(71) Applicant: SAMSUNG DISPLAY CO., LTD., Yongin-si (KR)

(72) Inventors: Jongman Bae, Hwaseong-si (KR); Heechang Kim, Hwaseong-si (KR); Chang-mo Park, Seoul (KR); Jinwook Yang, Hwaseong-si (KR); Soyeon Eom, Daegu (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/177,601

(22) Filed: Nov. 1, 2018

(65) Prior Publication Data
US 2019/0210351 A1   Jul. 11, 2019

(30) Foreign Application Priority Data

Jan. 5, 2018   (KR) .......................... 10-2018-0001880

(51) Int. Cl.
*B32B 43/00* (2006.01)

(52) U.S. Cl.
CPC ........ *B32B 43/006* (2013.01); *B32B 2457/20* (2013.01); *H01L 2221/6839* (2013.01);
(Continued)

(58) Field of Classification Search
CPC ............. B32B 43/006; Y10T 156/1153; Y10T 156/1179; Y10T 156/1184; Y10T 156/1911; Y10T 156/1983; H01L 2221/68381; H01L 2221/68386; H01L 2221/6839; Y10S 156/924; Y10S 156/93;
(Continued)

(56) References Cited

U.S. PATENT DOCUMENTS

| 3,670,069 A * | 6/1972 | Mitchell ................. D01D 4/02 264/187 |
| 8,715,026 B2 * | 5/2014 | Ozawa ..................... H01J 9/52 313/582 |

(Continued)

FOREIGN PATENT DOCUMENTS

| JP | 2001-293464 | 10/2001 |
| JP | 2005-116346 | 4/2005 |

(Continued)

OTHER PUBLICATIONS

J-Plat Pat machine translation of JP2005-129318A. (Year: 2019).*

*Primary Examiner* — Mark A Osele
(74) *Attorney, Agent, or Firm* — F. Chau & Associates, LLC

(57) ABSTRACT

A method for separating a window includes providing a display device including a display panel, a window disposed on the display panel and including a color layer. An adhesive layer is disposed between the display panel and the window. Heat is applied to the display device. The method includes inserting a disassembling stick between the display panel and the window to separate an edge of the display panel from the window. The method includes cooling the display device. The method includes separating the display panel and the window from each other.

17 Claims, 12 Drawing Sheets

(52) U.S. Cl.
CPC ........ *Y10S 156/924* (2013.01); *Y10S 156/932* (2013.01); *Y10S 156/937* (2013.01); *Y10S 156/943* (2013.01); *Y10T 156/1153* (2015.01); *Y10T 156/1179* (2015.01); *Y10T 156/1911* (2015.01); *Y10T 156/1983* (2015.01)

(58) Field of Classification Search
CPC ............. Y10S 156/932; Y10S 156/937; Y10S 156/941; Y10S 156/943
See application file for complete search history.

(56) References Cited

U.S. PATENT DOCUMENTS

| | | | |
|---|---|---|---|
| 9,333,736 B2* | 5/2016 | Kumakura | B32B 43/006 |
| 9,526,166 B2* | 12/2016 | Jin | H04M 1/0266 |
| 10,019,108 B2* | 7/2018 | Heo | G06F 3/0412 |
| 2007/0247807 A1* | 10/2007 | Kondo | H01J 5/08 361/688 |
| 2011/0146917 A1* | 6/2011 | Iwamoto | B32B 43/006 156/711 |
| 2013/0048224 A1* | 2/2013 | George | H01L 21/67282 156/752 |
| 2015/0318200 A1* | 11/2015 | Ohno | H01L 21/6838 414/797 |
| 2016/0378246 A1* | 12/2016 | Kim | G06F 3/0412 345/173 |
| 2018/0305594 A1* | 10/2018 | Decato | C09J 175/14 |

FOREIGN PATENT DOCUMENTS

| | | |
|---|---|---|
| JP | 2005129318 A * | 5/2005 |
| KR | 10-1276263 | 6/2013 |
| KR | 1020140090880 | 7/2014 |
| KR | 10-1430111 | 8/2014 |
| KR | 1020140122933 | 10/2014 |
| KR | 10-1767106 | 8/2017 |

* cited by examiner

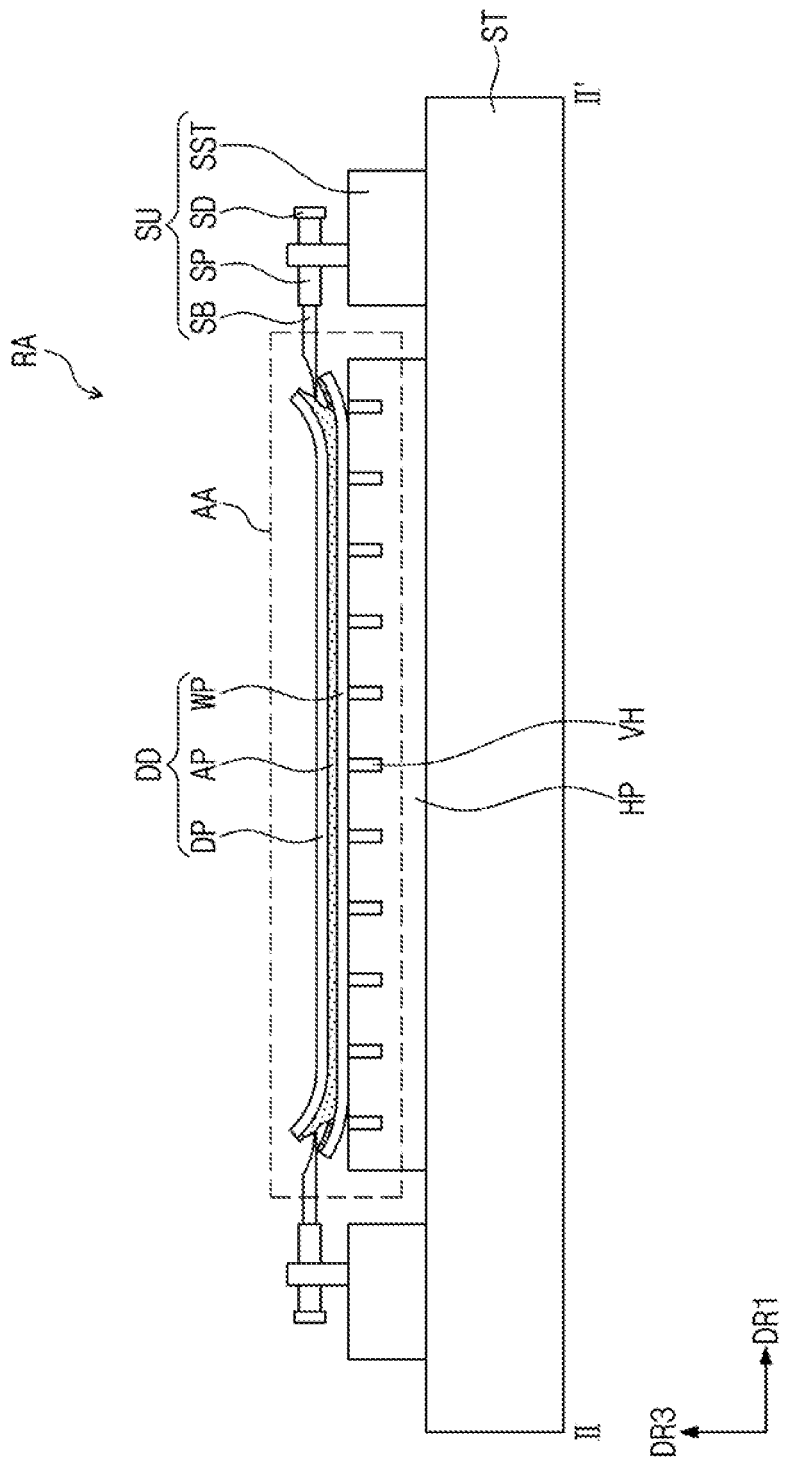

APPARATUS FOR SEPARATING A WINDOW AND METHOD FOR SEPARATING A WINDOW USING THE SAME

CROSS-REFERENCE TO RELATED APPLICATION

This U.S. non-provisional patent application claims priority under 35 U.S.C. § 119 to Korean Patent Application No. 10-2018-0001880, filed on Jan. 5, 2018, the disclosure of which is incorporated by reference herein in its entirety.

TECHNICAL FIELD

Exemplary embodiments of the present invention relate to an apparatus for separating a window, and more particularly to a method for separating a window using the same.

DISCUSSION OF RELATED ART

Various types of display devices may provide image information in electronic devices such as smart phones, tablet PCs, notebook computer, or smart televisions. Such a display device may include a display panel and a window protecting the display panel. The window and the display panel may be coupled to each other by using an optical transparent adhesive.

When display panel failures occur, the window may be reused by separating the window from the display panel.

SUMMARY

An exemplary embodiment of the present invention provides a method for separating a window, which is capable of separating the window from a display panel while minimizing damage of a color layer included in the window.

An exemplary embodiment of the present invention provides an apparatus for separating a window, which is capable of separating a window member from a display panel while minimizing damage of a color layer.

An exemplary embodiment of the present invention provides a method for separating a window includes providing a display device including a display panel, a window disposed on the display panel and including a color layer. An adhesive layer is disposed between the display panel and the window. Heat is applied to the display device. The method includes inserting a disassembling stick between the display panel and the window to separate an edge of the display panel from the window. The method includes cooling the display device. The method includes separating the display panel and the window from each other.

In an exemplary embodiment of the present invention, the color layer may be disposed on an edge of the window on a bottom surface of the window adjacent to the adhesive layer.

In an exemplary embodiment of the present invention, the color layer may include a plurality of ink-printed layers.

In an exemplary embodiment of the present invention, the display device may include a flat area and a bending area bent from at least one side of the flat area.

In an exemplary embodiment of the present invention, the color layer may be disposed in the bending area.

In an exemplary embodiment of the present invention, the applying of heat to the display device may include placing the display device on a heating plate and heating the display device at a temperature of from about 50° C. to about 150° C.

In an exemplary embodiment of the present invention, the disassembling stick may include at least one of polyethylene, acetal, or mono cast nylon.

In an exemplary embodiment of the present invention, the inserting the disassembling stick between the display panel and the window may include moving the disassembling stick to sequentially separate different edges of the display panel and the window at different sides of the display device.

In an exemplary embodiment of the present invention, in the inserting the disassembling stick between the display panel and the window, the display panel and the window may each be in direct contact with the adhesive layer in a central area of the display device. The adhesive layer may be separated from at least one of the display panel and the window at the edge of the display device.

In an exemplary embodiment of the present invention, the applying heat to the display device and the inserting the disassembling stick between the display panel and the window may be performed at substantially a same time as each other.

In an exemplary embodiment of the present invention, the cooling of the display device may be performed at a temperature of from about −110° C. to about −60° C.

In an exemplary embodiment of the present invention, in the cooling the display device, the display device may be disposed on a cooling plate or immersed in a low-temperature bath.

In an exemplary embodiment of the present invention, the low-temperature bath may include dry ice or liquid nitrogen.

In an exemplary embodiment of the present invention, the method may include cleaning the window after separating the display panel and the window from each other.

In an exemplary embodiment of the present invention, an apparatus for separating a window includes a heating unit on which a display device including a display panel, a window disposed on the display panel and including a color layer, and an adhesive layer disposed between the display panel and the window is placed. A disassembling unit is disposed on at least one side of the heating unit and includes a disassembling stick configured to separate an edge of the display panel from the window.

In an exemplary embodiment of the present invention, the heating unit may include a heating plate adjacent to the display device. A heating controller may be configured to control the heating plate.

In an exemplary embodiment of the present invention, the heating plate may include a central portion and a peripheral portion adjacent to the central portion. The central portion and the peripheral portion may be configured to have temperatures different from each other.

In an exemplary embodiment of the present invention, the display device may include a display area and a non-display area adjacent to the display area. The color layer may be disposed in the non-display area. The non-display area may overlap the peripheral portion. The peripheral portion may be configured to have a temperature higher than that of the central portion.

In an exemplary embodiment of the present invention, the display device may include a flat area and a bending area bent from at least one side of the flat area. The display device may be placed on the heating plate in a direction in which a bending direction of the bending area is bent away from the heating plate.

In an exemplary embodiment of the present invention, the disassembling stick may include a curved portion having a curvature corresponding to the bending area.

An exemplary embodiment of the present invention provides a method of separating a window from a display panel including providing a display device including a display panel, a window disposed on the display panel, and an adhesive layer disposed between the display panel and the window. The display panel and the window have a flat central part and a curved edge part. The method includes substantially simultaneously applying heat to the display device, and inserting a disassembling stick between the curved edge part of the display panel and the window. Inserting the disassembling stick between the curved edge part of the display panel and the window separates the display panel from the window at the curved edge part. The method includes cooling the display device. The method includes completely separating the window from the display panel in the cooled display device.

In an exemplary embodiment of the present invention, a color layer disposed on the window may remain disposed on the window after the window is completely separated from the display panel.

In an exemplary embodiment of the present invention, the adhesive layer may be entirely disposed on the display panel after the window is completely separated from the display panel.

BRIEF DESCRIPTION OF THE FIGURES

The above and other features of the present invention will become more apparent by describing in detail exemplary embodiments thereof with reference to the accompanying drawings, in which:

FIG. 5B is a cross-sectional view, taken along line II-II', of the apparatus for separating the window of FIG. 5A;

DETAILED DESCRIPTION

Figure 1:
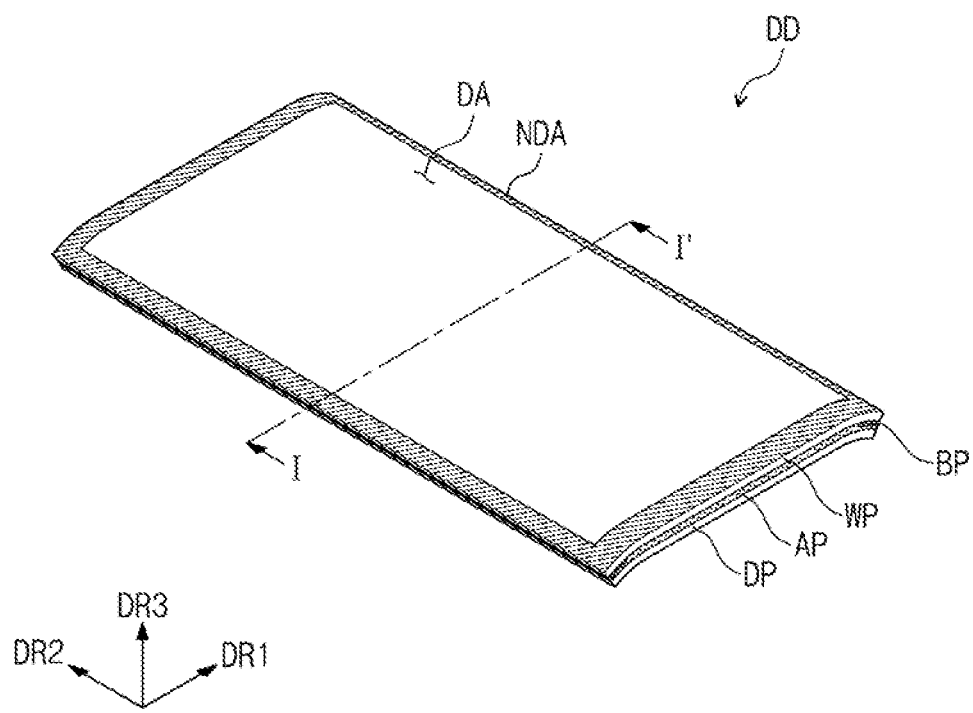
FIG. 1 is a perspective view of a display device separated through a method for separating a window according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings. In the drawings, the dimensions and size of each structure may be exaggerated for clarity of description, omitted, or schematically illustrated for clarity of description. It will be understood that although the terms such as 'first' and 'second' may be used herein to describe various elements, these elements should not be limited by these terms.

In the specification, it will be understood that when a layer (or, e.g., film), a region, or a plate is referred to as being 'on' or on 'an upper portion of' another layer, region, or plate, it can be directly on the other layer, region, or plate, or intervening layers, regions, or plates may also be present.

An apparatus and method for separating a window according to an exemplary embodiment of the present invention will be described in more detail below with reference to the accompanying drawings.

Figure 2:
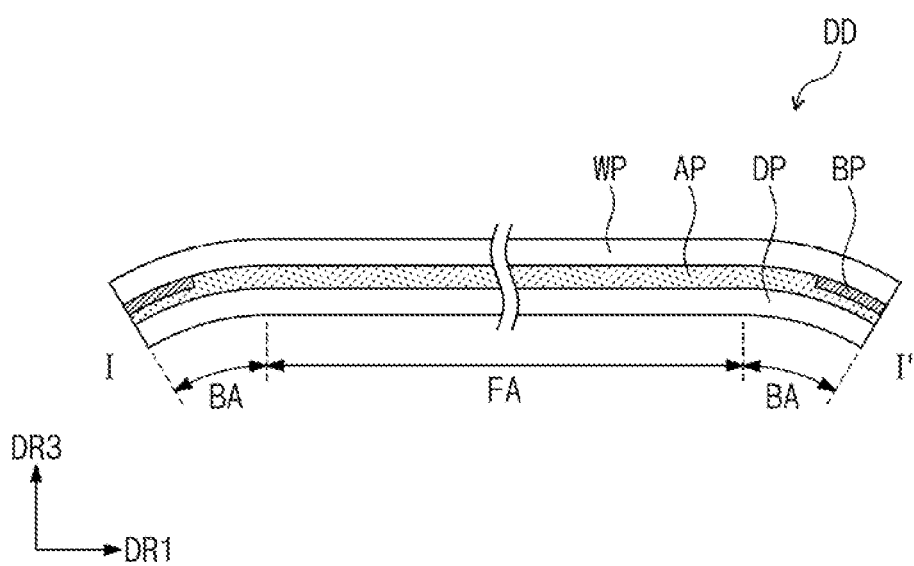
FIG. 2 is a cross-sectional view taken along line I-I' of FIG. 1.

FIG. 1 is a perspective view of a display device separated through a method for separating a window according to an exemplary embodiment of the present invention. FIG. 2 is a cross-sectional view taken along line I-I' of FIG. 1.

Referring to FIGS. 1 and 2, a display device DD may include a display panel DP, a window WP disposed on the display panel DP, and an adhesive layer AP disposed between the display panel DP and the window WP. The adhesive layer AP may adhere the display panel DP To the window WP.

The display device DD may include a display area DA on which an image is displayed and a non-display area NDA that is adjacent to the display area DA. The non-display area NDA may be an area on which an image is not displayed and may be an edge area or a bezel area in the display device DD. The non-display area NDA may surround the display area DA (e.g., on four sides of the display area when viewed in a plan view) and be disposed outside the display area DA. However, exemplary embodiments of the present invention are not limited thereto. For example, the display area DA and the non-display area NDA may have different shapes and sizes, as desired. As an example, the non-display area NDA may be disposed on less than four sides of the display area DA in a plan view.

The display area DA may include a display surface parallel to a surface defined by a first directional axis DR1 and a second directional axis DR2. A normal direction of the display surface of the display area DA (e.g., a thickness direction of the display device DD) may extend in a third directional axis DR3. The third directional axis DR3 may be perpendicular to the first directional axis and the second directional axis DR2. Thus, the third directional axis DR3 maybe orthogonal to the display surface of the display area DA. A front surface (e.g., or top surface) and a rear surface (e.g., or bottom surface) of each layer of the display device DD may be spaced apart from each other in the third directional axis DR3. However, directions indicated as the first to third directional axes DR1, DR2, and DR3 may be a relative concept and thus changed into different directions. First to third directions herein may respectively be directions indicated by the first to third directional axes DR1, DR2, and DR3 and designated by the same reference numerals, respectively. Thus, the first to third directional axes DR1, DR2, and DR3 may interchangeably be referred to herein as first to third directions, respectively.

Icons for operating the display device DD (e.g., members or devices) such as a camera or a sensor may be disposed on the non-display area NDA of the display device DD. For example, mechanically operated buttons or touch sensitive buttons may be incorporated into the non-display area NDA of the display device DD, and may be used to operate a device including the display device DD (e.g., a Smartphone). A color layer BP may be disposed in the non-display area. The color layer BP may reduce or eliminate exposure of the provided members and may distinguish the display area DA and the non-display area NDA from each other and may reduce or eliminate light leakage from occurring at a boundary between the display area DA and the non-display area NDA. The color layer BP will be described below in more detail. The color layer BP may be an opaque layer (e.g., including a relatively dark pigment), which may prevent light from being transmitted through the non-display area NDA of the display device DD.

The display device DD may include a flat area FA and a bending area BA that is bent from at least one side of the flat area FA. The bending area BA may include two areas that are bent at opposite sides of the flat area FA in the display device DD e.g., along the first direction DR1) according to an exemplary embodiment of the present invention, exemplary embodiments of the present invention are not limited thereto. For example, although two bending areas BA may be bent at opposite sides with respect to a center of the flat area, exemplary embodiments of the present invention are not limited thereto. For example, four bending areas BA may respectively extend from four side surfaces of the flat area FA (e.g., when the flat area FA has a substantially square or rectangular shape).

The flat area FA and the bending area BA may divide the display area DA according to the shape of the display device DD. The display area DA may be disposed in the flat area FA and may extend into a portion of the bending area. Alternatively, the display area DA may be disposed entirely in the flat area. The non-display area NDA may be disposed in the flat area FA and in a portion of the bending area BA.

The bending area BA may be a portion that extends from at least one side of the flat area FA and is bent. For example, the bending area BA may be bent in a direction toward a bottom surface of the display device DD. For example, in an exemplary embodiment of the present invention, in the display device DD, the bending area BA may be bent with respect to the flat area FA in a direction opposite to a direction of the third directional axis DR3, in which an image is provided to the user. However, exemplary embodiments of the present invention are not limited thereto. For example, in the display device DD according to an exemplary embodiment of the present invention, the bending area BA may be bent in the direction of the third directional axis DR3 with respect to the flat area FA. The bending area BA may include two areas bent in a direction opposite the third directional axis DR3 on two opposite sides of the flat area FA. Alternatively, the bending area BA may include four areas bent in a direction opposite the third directional axis DR3 on each of four sides of the flat area FA.

The display device DD may be a rigid display device. However, exemplary embodiments of the present invention are not limited thereto. For example, the display DD may be a flexible display device. Although the display device DD may be capable of being applied to portable terminals, exemplary embodiments of the present invention are not limited thereto. For example, the display device DD according to an exemplary embodiment of the present invention may be applied to relatively large-sized electronic devices such as televisions and monitors and relatively small and middle-sized electronic devices such as tablet PCs, navigation units for vehicles, game consoles, or smart watches. The display device DD may be a display device that is permanently fixed in a bent state. Alternatively, the display device DD may be a display device that is bendable and may be in a bent state or a substantially flat state at different times.

The display panel DP included in the display device DD may include a liquid crystal display panel, an electrophoretic display panel, an organic light emitting display panel, a field emission display panel, a surface-conduction electron-emitter display panel, a plasma display panel, or a cathode ray display panel. However, exemplary embodiments of the present invention are not limited thereto, and various types of display panels for providing an image to the user may be used.

The window WP may protect the display panel DP against an external impact and provide an input surface to a user. The window WP may include a glass substrate or a plastic substrate. The window WP may include a glass substrate or a plastic substrate coated with various functional layers such as a hard coating layer. The window WP may have a multilayered structure selected from a glass substrate, a plastic film, or a plastic substrate.

The window WP may include a color layer BP. The color layer BP may be disposed on at least one surface of the window WP. For example, the color layer BP may be disposed on a bottom surface of the window WP facing the display panel DP. Thus, the color layer BP may be disposed between the display panel DP and the window WP. The color layer BP may be disposed on an edge of the window WP (e.g., at an outermost area of the window WP opposite the display area DA. The color layer BP may be disposed in the non-display area NDA of the display device DD (e.g., without overlapping the display area DA). The color layer BP may be mainly disposed in the bending area BA of the display device DD; however, a portion of the color layer BP may be disposed in the flat area FA.

The color layer BP may have a light blocking function. The color layer BP may be an ink-printed layer printed with ink. The color layer BP may include a plurality of ink-printed layers. When the color layer BP includes the plurality of ink-printed layers, the number of the plurality of ink-printed layers may vary according to an area on which the color layer BP is provided. For example, the number of ink-printed layers included in the color layer BP at the portion on which the member such as the camera or the sensor is provided may be less than that of ink-printed layers at a portion on which the member is not provided. For example, the color layer BP may be provided as one ink-printed layer at the portion on which the member such as the camera or the sensor is provided, and a structure in which three or more ink-printed layers are laminated may be provided at portions on which the member is not provided.

When the color layer BP includes the plurality of ink-printed layers, each of the plurality of ink-printed layers may be printed with ink having colors different from each other. As an example, at least two ink-printed layers may have printed with ink having the same color as each other. The ink provided for forming the color layer BP may include a pigment or dye for realizing a color in a transparent resin.

The display device DD may include an adhesive layer AP disposed between the display panel DP and the window WP. The adhesive layer AP may be an optical clear adhesive. The adhesive layer AP may be disposed on substantially an entire top surface of the display panel DP (e.g., a surface of the display panel DP facing the window WP) to substantially entirely overlap the display panel DP and the window WP. The adhesive layer AP may be an optical clear adhesive including an acrylic polymer material.

Figure 3:
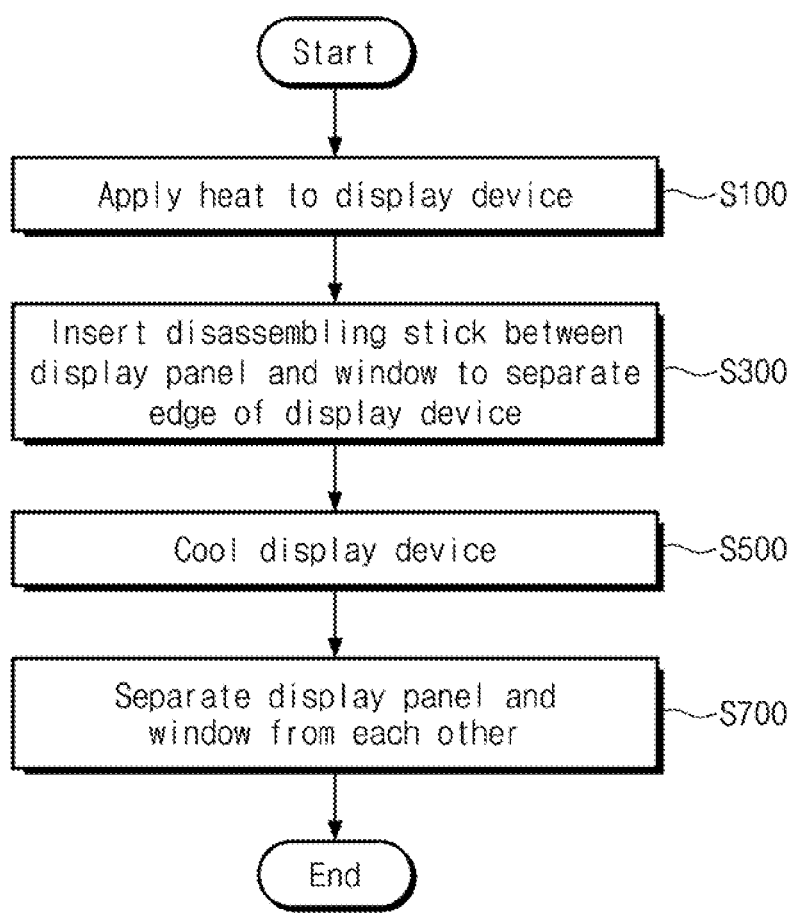
FIG. 3 is a flowchart of a method for separating a window according to an exemplary embodiment of the present invention.

FIG. 3 is a flowchart illustrating a method for separating a window according to an exemplary embodiment of the present invention. The method for separating a window according to an exemplary embodiment of the present invention may include a process (S100) of applying heat to a display device, a process (S300) of inserting a disassembling stick between a display panel and a window and separating an edge of the display device, a process (S500) of cooling the display device, and a process (S700) of separating the display panel and the window from each other.

A method for separating a window according to an exemplary embodiment of the present invention may be a method for separating the display DP and the window WP from each other in the display device DD, which includes the display panel DP, the window WP, and the adhesive layer AP disposed between the display panel DP and the window WP. For example, the method for separating the window according to an exemplary embodiment of the present invention may be a method for separating the window WP including the color layer BP from the display panel DP. Thus, the color layer BP may remain disposed on the window WP after the window WP is separated from the display panel DP.

In a method for separating a window according to an exemplary embodiment of the present invention, the process of providing the display device may be a process of providing the display device DD. For example, the process of providing the display device may be a process of providing the display device DD including the display panel DP, the window WP disposed on the display panel DP and including the color layer BP, and the adhesive layer AP disposed between the display panel DP and the window WP to an apparatus for separating the window (see, e.g., apparatus RA described in more detail below with reference to FIG. 5A).

A method for separating a window according to an exemplary embodiment of the present invention may include the process (S100) of applying heat to the display device DD. In the process (S100) of applying heat to the display device DD, heat may be directly or indirectly applied to the display device DD. The direct application of heat may be a method in which a heating unit for providing heat to the display device DD comes into direct contact with the display device DD to transfer heat to the display device DD. The indirect application of heat may be a process in which the display device DD is disposed under a high-temperature atmosphere, for example, within a chamber or an oven maintained in a relatively high temperature to heat the display device DD.

When heat is applied to the display device DD, the adhesive layer AP may be softened to reduce adhesion force of the adhesive layer AP with respect to the window WP and the display panel DP. When a method for separating a window includes the process (S100) of applying heat to the display device DD according to an exemplary embodiment of the present invention, the window WP and the display panel DP may be more easily separated from each other. The process (S100) of applying heat to the display device DD may be a process of directly applying heat to the window WP or a process of directly applying heat to the display panel DP. For example, the window WP may come into direct contact with the heating unit to apply heat to the display device DD. Alternatively, the display panel DP may come into direct contact with the heating unit to apply heat the display device DD.

According to an exemplary embodiment of the present invention, an adhesive force between the display panel DP and the adhesive layer AP may be greater than an adhesive force between the window WP and the adhesive layer AP. Thus, the adhesive layer AP may substantially remain adhered to the display panel DP when the window WP and display panel DP are separated from each other. Any residual adhesive layer AP remaining adhered to the window WP may be cleaned from the window WP (e.g., before the window WP cools to room temperature).

Figure 4:
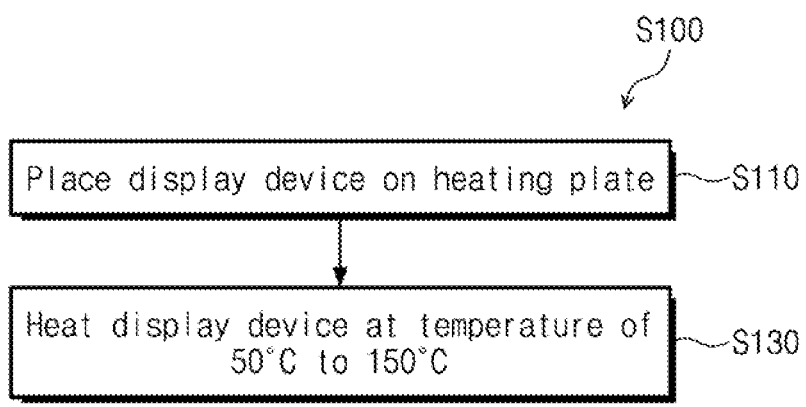
FIG. 4 is a flowchart of a portion of a process of separating the window of FIG. 3.

FIG. 4 is a flowchart of a portion of a process of separating the window of FIG. 3.

Referring to FIG. 4, the process (S100) of applying heat to the display device may include a process (S110) of placing the display device on a heating plate and a process (S130) of heating the display device at a temperature of from about 50° C. to about 150° C.

In the process (S110) of placing the display device on the heating plate, one surface of the display device DD may be directly disposed on the heating plate to apply heat to the display device DD. For example, in an exemplary embodiment of the present invention, the display device DD may be disposed on the heating plate so that a surface of the window WP is adjacent to the heating plate. For example, the process (S110) of placing the display device on the heating plate may be a process of applying heat to the display device DD in a manner in which the display device DD is directly heated.

As an example, when the display device DD includes the flat area FA and the bending area BA, the display device DD may be disposed on the heating plate so that the flat area FA is closer to the heating plate than the bending area BA. Here, the bending area BA may be bent in a direction that is away from the heating plate. Alternatively, the display device DD may be positioned with the bending area BA bending toward the heating plate, and thus the heating plate may be dimensioned and positioned to come into direct contact with the display device DD (e.g., with the display panel DP of the display device DD) without overlapping the bending area BA.

In the process (S100) of applying heat to the display device, the display device DD may be heated at a temperature of from about 50° C. to about 150° C. When the display device DD is heated at a temperature less than about 50° C., the adhesive layer AP might not be sufficiently softened, and thus, fluidity of the adhesive layer AP might not be secured. Therefore, it may be difficult to separate the display panel DP and the window WP from each other. Also, when the display device DD is heated at a temperature exceeding about 150° C., although the adhesive layer AP may be sufficiently softened, the color layer BP provided in the window WP may be damaged. For example, the display device DD may be heated at a temperature of form about 80° C. to about 100° C.

A temperature of heat applied in the process (S100) of applying heat to the display device may be a temperature on the surface of the display device DD or a temperature of air around the display device DD. For example, when the display device DD is directly heated in the process of (S100) of applying heat to the display device, a temperature of the applied heat may be a temperature on the surface of the display device DD. For example, when the display device DD is directly heated to apply heat to the display device DD, the surface of the display device DD may be maintained at a temperature of from about 50° C. to about 150° C. For example, when the display device DD is indirectly heated in the process of (S100) of applying heat to the display device, a temperature of the applied heat may be a temperature around the display device DD. For example, when the display device DD is indirectly heated to apply heat to the display device DD, the surrounding of the display device DD may be maintained at a temperature of from about 50° C. to about 150° C.

A method for separating a window according to an exemplary embodiment of the present invention may include the process (S300) of inserting a disassembling stick between the display panel and the window to separate an edge of the display device. In the process (S300) of inserting the disassembling stick between the display panel and the window to separate the display device, heat may be applied to the display device DD to soften the adhesive layer AP and then partially separate the display panel from the window WP by using the disassembling stick. For example, in the process (S300) of inserting the disassembling stick between the display panel and the window to separate the edge of the display device, the display panel DP and the window WP may be separated from each other at the edge of the display device DD corresponding to the bending area BA of the display device DD. Also, in the process (S300) of inserting the disassembling stick between the display panel and the window to separate the edge of the display device, the disassembling stick may be inserted into the non-display area of the display device DD including the color layer BP to separate the display panel DP and the window WP from each other. For example, in the process (S300) of inserting the disassembling stick between the display panel and the window to separate the edge of the display device, the adhesive layer AP may be separated up to the portion, at which the color layer BP provided in at least the window WP is disposed, from the window WP or the display panel DP to partially separate the display panel DP and the window WP from each other. For example, the color layer BP may be disposed in the non-display area NDA, and separating edges of the display panel DP and the window WP from each other may include separating portions of the display panel DP and the window WP from each other that overlap the color layer BP.

The process (S300) of inserting the disassembling stick between the display panel and the window to separate the edge of the display device may be performed after the process (S100) of applying heat to the display device. For example, the adhesive layer AP provided in the display device DD may be sufficiently softened and then the process of separating the display panel DP and the window WP from each other may be performed. Alternatively, the processes of heating the display device DD and inserting the disassembling stick (e.g., disassembling stick DP) between the display panel DP and the window WP may be performed substantially simultaneously, or as a single continuous process in which the disassembling stick DP is inserted substantially immediately upon the display device DD reaching the temperature range described above in more detail. Thus, a speed with which the display panel DP and the window WP are separated from each other may be increased, disassembling costs may be reduced and process efficiency may be increased.

As an example, the process (S100) of applying heat to the display and the process (S300) of inserting the disassembling stick between the display panel and the window to separate the edge of the display device may be performed through a same process. For example, when a time taken to heat the display device DD in the process (S100) of applying heat to the display device is relatively short, the process (S100) of applying heat to the display device and the process (S300) of inserting the disassembling stick between the display panel and the window to separate the edge of the display device may be performed in one process at the same time.

Figure 5A:
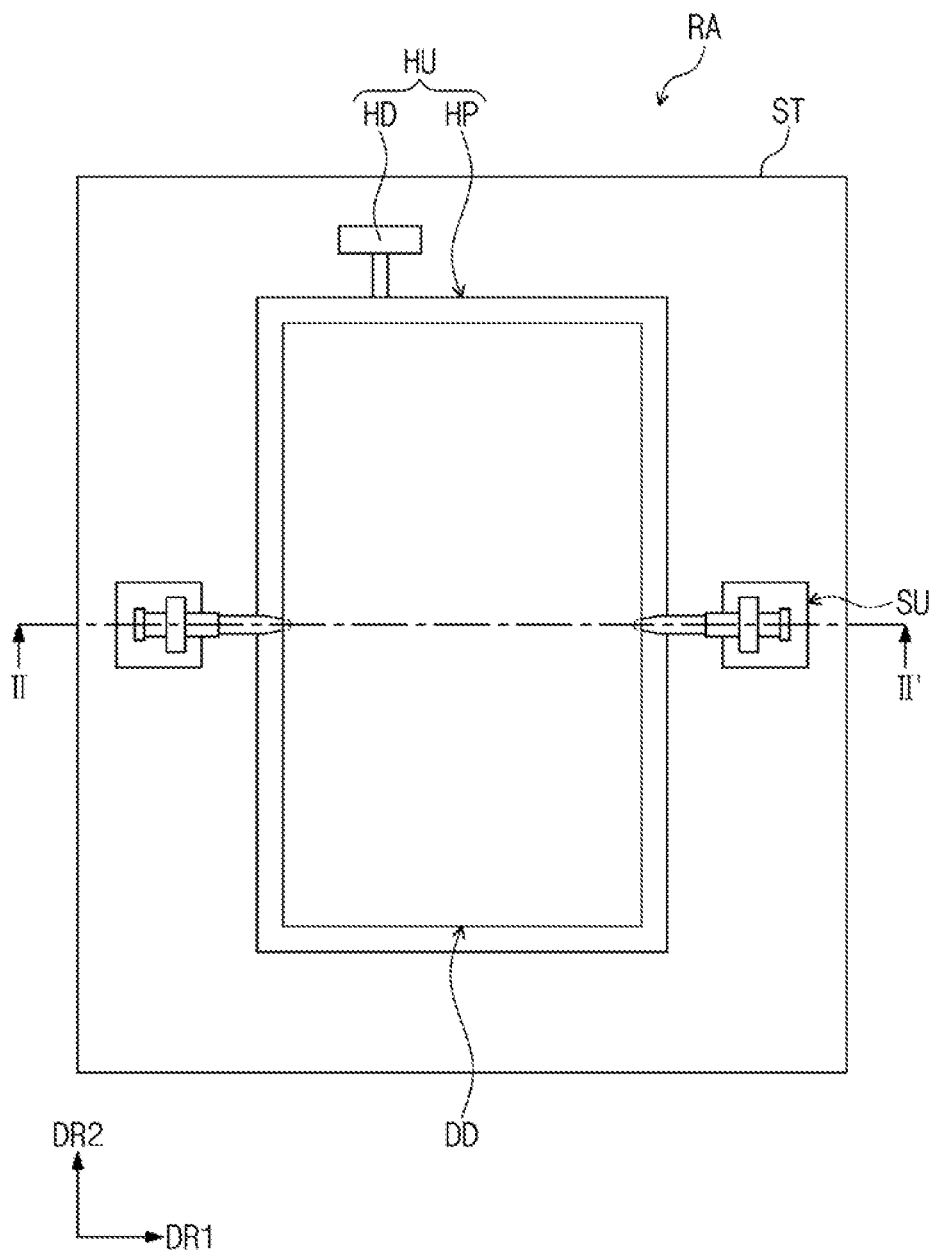
FIG. 5A is a plan view of an apparatus for separating a window according to an exemplary embodiment of the present invention.

The process (S100) of applying heat to the display and the process (S300) of inserting the disassembling stick between the display panel and the window to separate the edge of the display device may be performed in the apparatus for separating the window according to an exemplary embodiment of the present invention. FIG. 5A is a plan view of an apparatus for separating a window according to an exemplary embodiment of the present invention. FIG. 5B is a cross-sectional view, taken along line II-II', of the apparatus for separating the window of FIG. 5A.

Referring to FIGS. 5A and 5B, an apparatus for separating a window according to an exemplary embodiment of the present invention may include a heating unit HU on which the display device DD is placed and a disassembling unit SU for separating the edge of the display device DD (e.g., edges of the display panel DP and the window WP from each other). An apparatus for separating a window according to an exemplary embodiment of the present invention will be described below in more detail.

The process (S300) of inserting the disassembling stick between the display panel and the window to separate the edge of the display device may be a process of sequentially separating different edges of the display device DD. For example, when the display device DD has a rectangular shape on the plane (e.g., in a plan view), edges adjacent to four sides of the display device DD may be sequentially separated along each of the four sides. As an example, edges of the display device DD may be separated from each other at substantially the same time as each other. For example, different edges (e.g., four edges of the display device DD having a square or rectangular shape) may be separated at substantially the same time as each other by using a plurality of disassembling sticks.

In the process (S300) of inserting the disassembling stick between the display panel and the window to separate (e.g., to sequentially separate) the edges of the display device, the separation order of the edges of the display device DD may be determined according to a shape of the display device DD.

The process (S300) of inserting the disassembling stick between the display panel and the window to separate the edge of the display device may be a process of preferentially separating a particular edge or particular edges of the display device DD. For example, in the process (S300) of inserting the disassembling stick between the display panel and the window to separate the edge of the display device, the state in which the display panel DP, the adhesive layer AP, and the window WP are in direct contact with each other may be at least partially maintained. The adhesive layer AP may be separated from at least one of the display panel DP and the window WP at the edge of the display device DD, but not at an area spaced apart from the edges of the display panel DP and the window WP. For example, the display panel DP and the window WP might be separated from each other only at edges of the display panel DP and the window WP overlapping the color layer BP.

According to an exemplary embodiment of the present invention, a method of separating the window WP from the display panel DP may include providing the display device DD including the display panel DP, the window WP disposed on the display panel DP, and the adhesive layer AP disposed between the display panel DP and the window WP. The display panel DP and the window WP may have a flat central part (e.g., flat area FA) and a curved edge part (e.g., bending area BA). The method may include substantially simultaneously applying heat to the display device DD and inserting the disassembling stick SB between the curved edge part of the display panel DP and the window WP. Inserting the disassembling stick SB between the curved edge part of the display panel DP and the window WP may separate the display panel DP from the window WP at the curved edge part. The method may include cooling the display device DD. The method may include completely separating the window WP from the display panel DP in the cooled display device DD.

In an exemplary embodiment of the present invention, the color layer BP disposed on the window WP may remain disposed on the window WP after the window WP is completely separated from the display panel DP.

Figure 8:
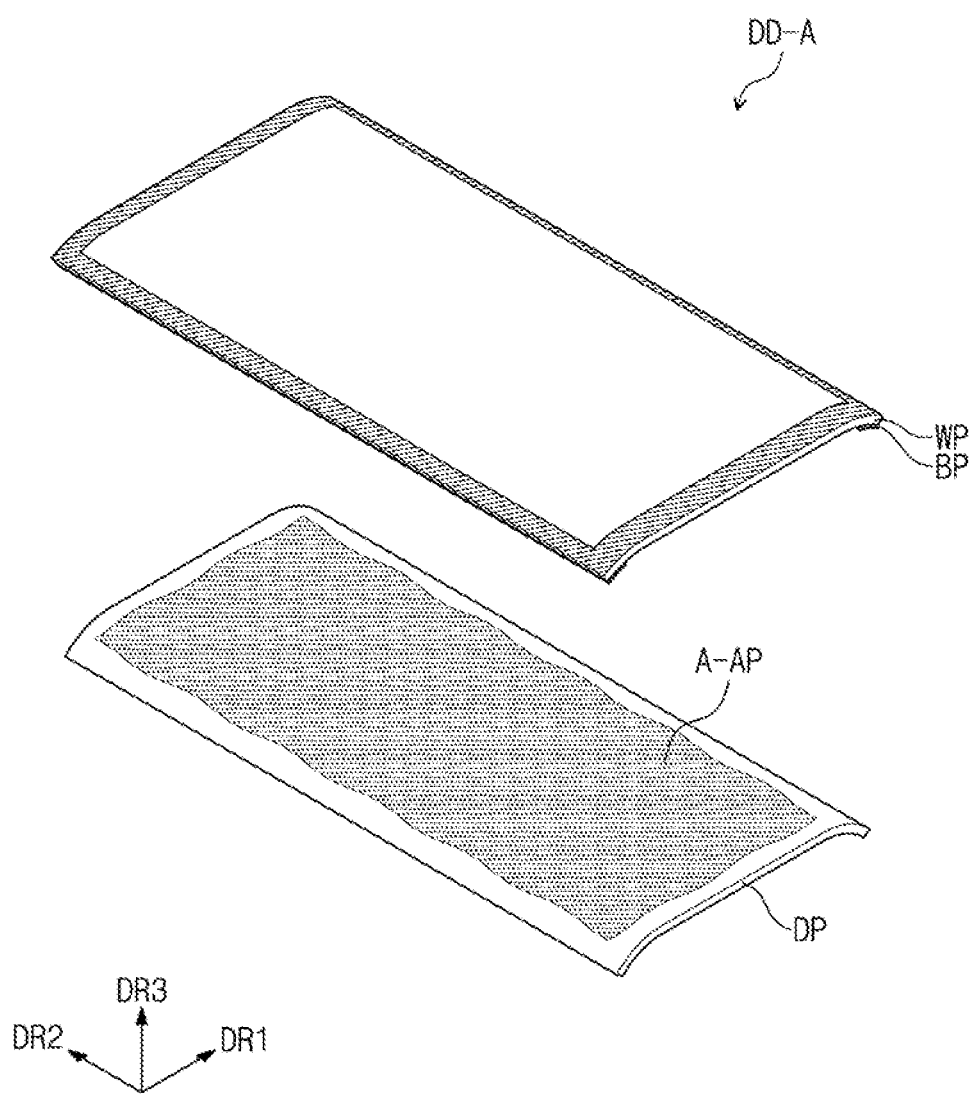
FIG. 8 is a perspective view illustrating a state in which a display panel and a window are completely separated from each other according to an exemplary embodiment of the present invention.

In an exemplary embodiment of the present invention, the adhesive layer AP may be entirely disposed on the display panel DP after the window WP is completely separated from the display panel DP (see, e.g., FIG. 8).

Figure 6:
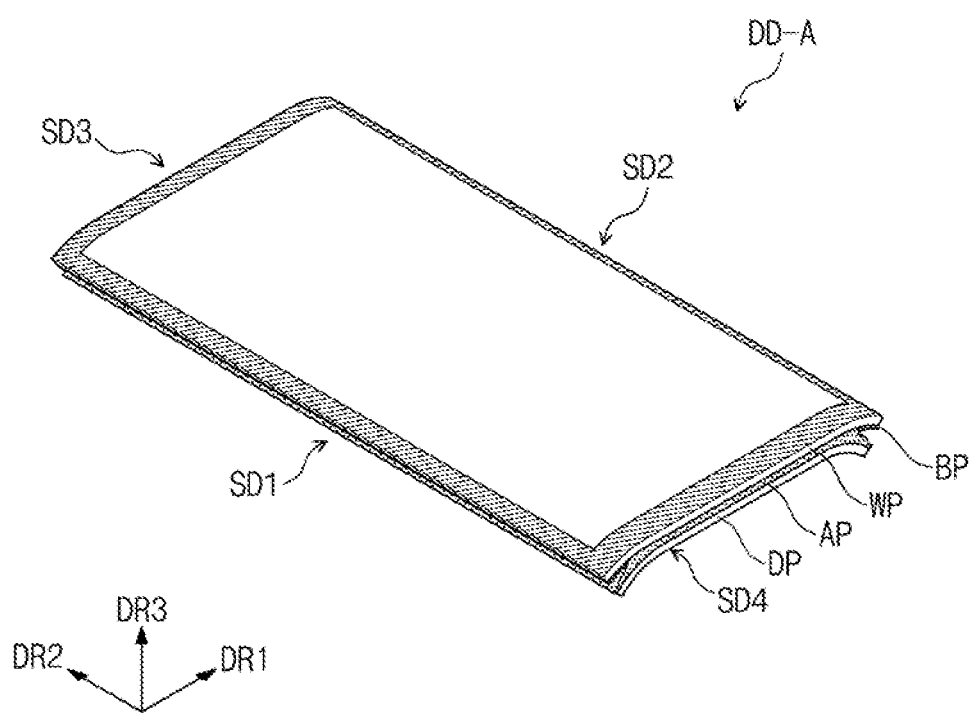
FIG. 6 is a perspective view of a display device in which a display panel and a window are partially separated from each other according to an exemplary embodiment of the present invention.

FIG. 6 is a perspective view of a display device in which a display panel and a window are partially separated from each other according to an exemplary embodiment of the present invention.

FIG. 6 is a view illustrating a state in which the display panel DP and the window WP are separated from each other at edges of a display device DD-A (e.g., at four side surfaces SD1, SD2, SD3, and SD4) of the display device DD-A. The description of the display device DD-A below with reference to, for example, FIG. 6 may similarly apply to the display device DD described herein (e.g., with reference to FIGS. 1 and 2 above). Referring to FIG. 6, the display device DD-A may have, for example, a square or rectangular shape. For example, after the process (S300) of inserting the disassembling stick between the display panel and the window to separate the edge of the display device, the display panel DP and the window WP may be separated from each other at the edges of the display device DD-A. Thus, a central area of the display device DD-A may be maintained in a state in which the adhesive layer AP is not separated, but the display panel DP and the window WP remain adhered to each other.

A method for separating a window according to an exemplary embodiment of the present invention may include the process (S500) of cooling the display device after the process (S300) of inserting a dissembling stick between the display panel and the window to separate the edge of the display device. The process (S500) of cooling the display device may be a process of cooling the display device DD-A in which the display panel DP and the window WP are separated from each other at edges thereof, without being separated at the central area of the display device DD-a.

In the process (S500) of cooling the display device, the display device may be directly or indirectly cooled. The direct cooling of the display device DD-A may be a method in which the display device DD-A is directly disposed on a cooling unit such as a cooling plate to reduce a temperature of the display device DD-A. Indirect cooling of the display device DD-A may be a method in which the display device DD is disposed under a low-temperature atmosphere, for example, in a chamber maintained at a low temperature or a low-temperature bath in which a low-temperature gas or liquid is filled to reduce a temperature of the display device DD-A. The process (S500) of cooling the display device may be a process of cooling the display device DD-A at a temperature less than a glass transition temperature $T_g$ of the adhesive layer AP to reduce adhesion force of the adhesive layer AP.

In the process (S500) of cooling the display device, the display device DD-A may be cooled at a temperature of from about −110° C. to about −60° C. When the display device DD-A is cooled at a temperature below about −110° C., the window WP may be damaged, and the color layer BP may be delaminated. Additionally, when the display device DD-A is cooled at a temperature exceeding about −60° C., a decrease in adhesion force of the adhesive layer AP may be relatively small, and thus, it may be difficult to separate the display panel DP and the window WP from each other. For example, the display device DD-A may be cooled at a temperature of from about −100° C. to about −80° C.

When the display device DD-A is indirectly cooled in the process (S500) of cooling the display device, dry ice or liquid nitrogen may be used to reduce a temperature of the display device DD-A. As discussed below in more detail with reference to FIG. 7, the display device DD-A may be exposed to a refrigerant such as dry ice or liquid nitrogen in a low-temperature bath to cool the display device DD-A at a temperature less than a glass transition temperature $T_g$ of the adhesive layer AP to reduce adhesion force of the adhesive layer AP.

Figure 7:
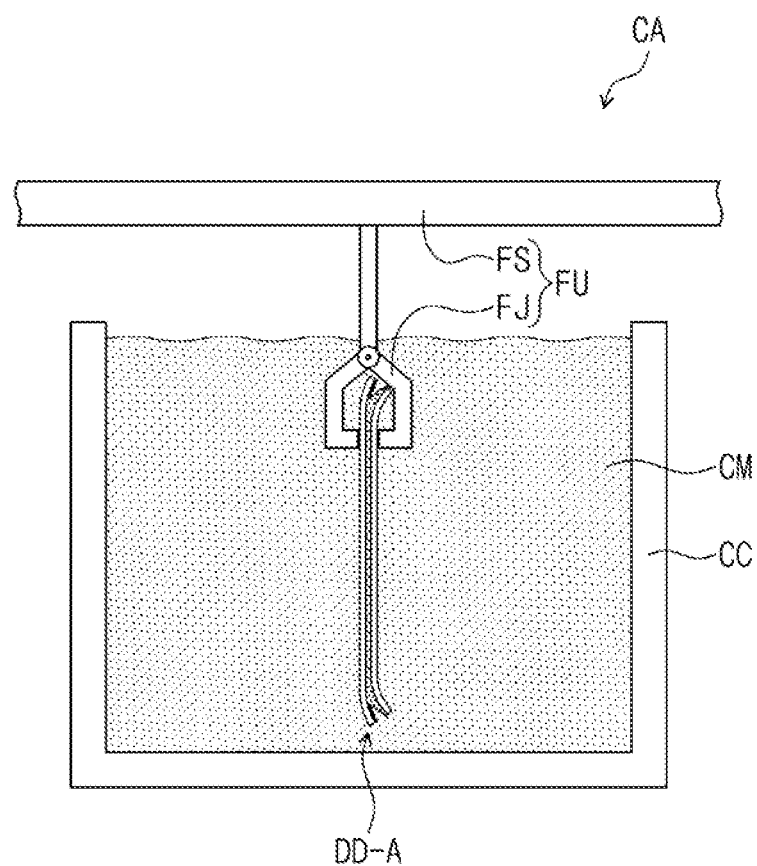
FIG. 7 is a side view of a process of cooling a display device of which a portion is separated according to an exemplary embodiment of the present invention.

FIG. 7 is a side view of a process of cooling a display device of which a portion is separated according to an exemplary embodiment of the present invention FIG. 7 illustrates an example in which the process (S500) of cooling the display device is performed in the method for separating the window according to an exemplary embodiment of the present invention. The description of the display device DD-A below with reference to, for example, FIG. 7 may similarly apply to the display device DD described herein (e.g., with reference to FIGS. 1 and 2 above). FIG. 7 is a view illustrating an example of a cooling unit CA for performing the process (S500) of cooling the display device. Referring to FIG. 7, the cooling unit CA may include a low-temperature bath CC in which the display device DD-A of which an edge is separated is immersed and a fixing unit FU for fixing and moving the display device DD-A. A liquid or gas refrigerant CM for cooling the display device DD-A may be filled in the low-temperature bath CC. Dry ice or liquid nitrogen may be used as the refrigerant CM. As an example, the edges of the display panel DP and the window WP (e.g., edges overlapping the color layer BP) may already have been separated from each other before the display device DD-A is cooled in the low-temperature bath CC. For example, the display device DD-A having been previously heated may be allowed to cool to approximately room temperature before being placed into the low-temperature bath CC.

The display device DD-A may be fixed to a grip part FJ of the fixing unit FU. The grip part FJ may be, for example, a clamp configured to grip and hold the display device DD-A. The grip part FJ may be fixed to a support part FS to control the support part so that the display device DD-A is immersed in the low-temperature bath CC and cooled and then moved out of the low-temperature bath CC. Although one display device DD-A may cooled within the low-temperature bath at a time, exemplary embodiments of the present invention are not limited thereto. For example, a plurality of display devices DD-A may be cooled within one low-temperature bath CC at the same time as each other.

After the process (S500) of cooling the display device, the process (S700) of separating the display panel and the window from each other may be performed. For example, the display panel DP and the window WP may be completely separated from each other in the process (S700). The process (S700) of separating the display panel and the window from each other may be a process of physically separating the display panel DP and the window WP from each other after the adhesion force of the adhesive layer AP is reduced in the process (S500) of cooling the display device. The process (S700) of separating the display panel and the window from each other may be a process of completely separating the display panel DP and the window WP from each other.

FIG. 8 is a perspective view illustrating a state in which a display panel and a window are separated from each other according to an exemplary embodiment of the present invention. The description of the display device DD-A below with reference to, for example, FIG. 8 may similarly apply to the display device DD described herein (e.g., with reference to FIGS. 1 and 2 above). Referring to FIG. 8, the process (S700) of separating the display panel and the window from each other may be manually performed by a worker or performed by using a separate device. When the display panel DP and the window WP are separated from each other, a separated adhesive layer A-AP may remain on at least one of the display panel DP and the window WP. For example, when the display panel DP and the window WP are separated from each other, substantially all or most of the adhesive layer A-AP may remain on one of the display panel DP and the window WP, and the residue of the separated adhesive layer A-AP, which remains after being transferred, may be transferred to the other of the display panel DP and the window WP. Particularly, the separated adhesive layer A-AP may be transferred to one surface of the adjacent display panel DP or transferred to one surface of the adjacent window WP, as desired. Also, the separated adhesive layer A-AP may substantially all be transferred to one surface of the display panel DP or one surface of the window WP.

FIG. 8 is a view illustrating a state in which substantially all of the separated adhesive layer A-AP remains on or is transferred to the display panel DP. A portion of the separated adhesive layer A-AP may remain as a residue on the window WP facing the separated adhesive layer A-AP. Thus, the residue may be cleaned from the window WP after the window WP is separated from the display panel DP.

The method for separating the window according to an exemplary embodiment of the present invention may further include a process of cleaning the window after the process (S700) of the separating the display panel and the window from each other. The process of cleaning the window may be a process of removing the residue of the separated adhesive layer A-AP, which remains on the window WP separated from the display panel DP. The process of cleaning the window may include at least one of a process of physically cleaning the window and a process of chemically cleaning the window. The process of physically cleaning the window and the process of chemically cleaning the window may each be performed (e.g., substantially simultaneously, or as a single continuous process).

Figure 9:
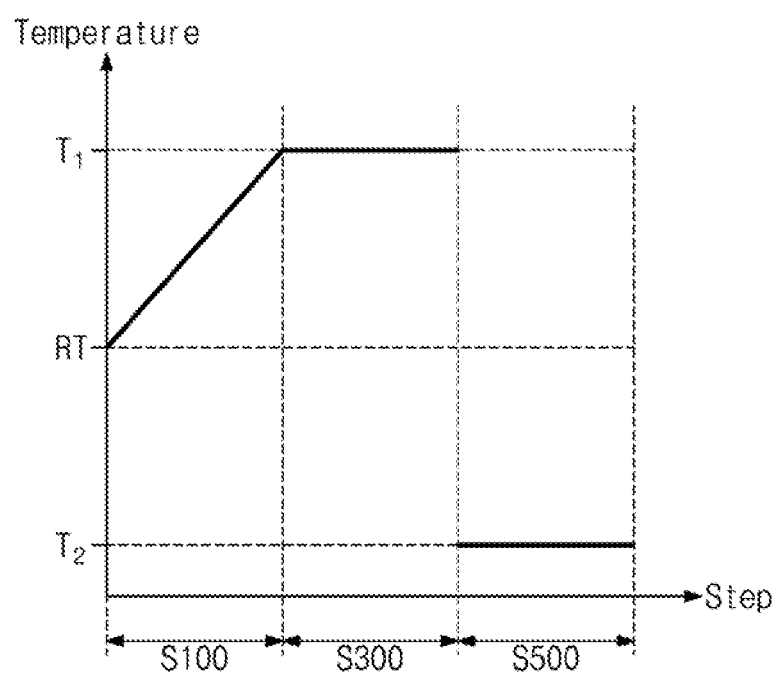
FIG. 9 is a chart of a temperature adjustment process in a method for separating the window according to an exemplary embodiment of the present invention.

FIG. 9 is a chart of a temperature adjustment process in a method for separating the window according to an exemplary embodiment of the present invention.

FIG. 9 illustrates a variation in process temperature in each of the processes of separating the window according to an exemplary embodiment of the present invention. The temperatures shown in FIG. 9 may be representative of the temperature of the display device in each process. In the process (S100) of applying heat to the display device, the display device may increase up to a temperature $T_1$ under room temperature RT. The temperature $T_1$ may range of from about 50° C. to about 150° C., and for example, about 80° C. to about 100° C. Although the display device may continuously (e.g., gradually) increase up to the temperature $T_1$ above room temperature RT in the process (S100) of applying heat to the display device, exemplary embodiments of the present invention are not limited thereto. For example, the temperature of the display device may increase in the form of a step in the process (S100) of applying heat to the display device.

In the process (S300) of inserting the disassembling stick between the display panel and the window to separate the edge of the display device, the display device may be maintained at the temperature $T_1$.

Next, in the process (S500) of cooling the display device, the display device may be maintained to a temperature $T_2$. The temperature $T_2$ may range from about −110° C. to about −60° C. For example, the temperature $T_2$ may be maintained in the range of about −100° C. to about −80° C.

While proceeding from the process (S300) of inserting the disassembling stick between the display panel and the window to separate the edge of the display device to the step (S500) of cooling the display device, the display device may be relatively quickly cooled from the temperature $T_1$ to the temperature $T_2$. However, exemplary embodiments of the present invention are not limited thereto. For example, after the process (S300) of inserting the disassembling stick between the display panel and the window to separate the edge of the display device, the display device may be cooled from the temperature $T_1$ to room temperature RT and then cooled to the temperature $T_2$ in stages.

In a method for separating a window according to an exemplary embodiment of the present invention, the display panel and the window may be separated from each other at the edge of the display device at a relatively high temperature, and then, the display device may be cooled to completely separate the window from the display panel, thus effectively separating the window from the display panel without damaging the window. A method for separating a window according to an exemplary embodiment of the present invention may include the process of separating the display panel and the window first at the edge of the display device at a relatively high temperature to separate the window from the display device without delaminating a color layer provided in the window.

An apparatus for separating a window according to an exemplary embodiment of the present invention will be described in more detail below.

Referring again to FIGS. 5A and 5B, FIG. 5A is a plan view of an apparatus RA for separating a window (e.g., of the display device DD), and FIG. 5B is a cross-sectional view taken along line II-II' of FIG. 5A.

The apparatus RA for separating a window according to an exemplary embodiment of the present invention may include the heating unit HU on which the display device DD is placed and the disassembling unit SU including the disassembling stick SB for separating an edge of the display device DD. The apparatus RA for separating the window according to an exemplary embodiment of the present invention may include a support table ST and the heating unit HU and the disassembling unit SU, which are disposed on the support table ST. The disassembling unit SU may be disposed on at least one side of the heating unit HU. For example, the apparatus RA for separating the window may include one disassembling unit SU or may include two or more disassembling units SU (e.g., a plurality of disassembling units SU). For example, a disassembling unit SU may be included on each of four sides of the display device DD (e.g., having a square or rectangular shape).

The apparatus RA for separating a window according to an exemplary embodiment of the present invention may include two disassembling units SU respectively disposed on opposite sides of the heating unit HU. The heating unit HU according to an exemplary embodiment of the present invention may include a heat plate HP applying heat to the display device DD and a heat controller HD controlling the heating plate HP. The heat controller may include, for example, a computer including a processor and a memory configured to control a temperature of the heating plate HP.

A plurality of vacuum suction holes VH may be defined in the heating plate HP on which the display device DD is seated. The vacuum suction holes VH may be configured to fix the display device DD. The vacuum suction holes VH may suction air to allow the display device DD to be held in a desired position on the heating plate HP.

The heating plate HP may apply heat to the display device DD. The heating plate may include a plurality of heaters. For example, a cartridge heater may be used as each of the heaters of the plurality of heaters. The heaters may be spaced apart from each other, and may be arranged, for example, in a matrix configuration.

The heating plate HP may be controlled in temperature and degree of vacuum by the heating controller HD. The heating controller HD may control an amount of air suctioned through the vacuum suction holes VH to fix and separate the display device DD and control a temperature of the heating plate HP to adjust a temperature of heat applied to the display device DD.

The heating controller HD may be disposed at one side of the heating plate HP when viewed in a plan view. The heating controller HD may be connected to the heating plate HP to control an operation of the heating plate HP. For example, the heating controller HD may control movement of the heating plate HP. The heating controller HD may move the heating plate HP on the support table ST in the direction of the first or second directional axis DR1 or DR2 or control the heating plate HP to be spaced apart from the support table ST in the direction of the third directional axis DR3. The heating plate HP may be coupled to a pneumatic arm configured to move the heating plate UP in the first or second directional axis DR1 or DR2, and the pneumatic arm may be controlled by the heat controller HD.

Figure 10:
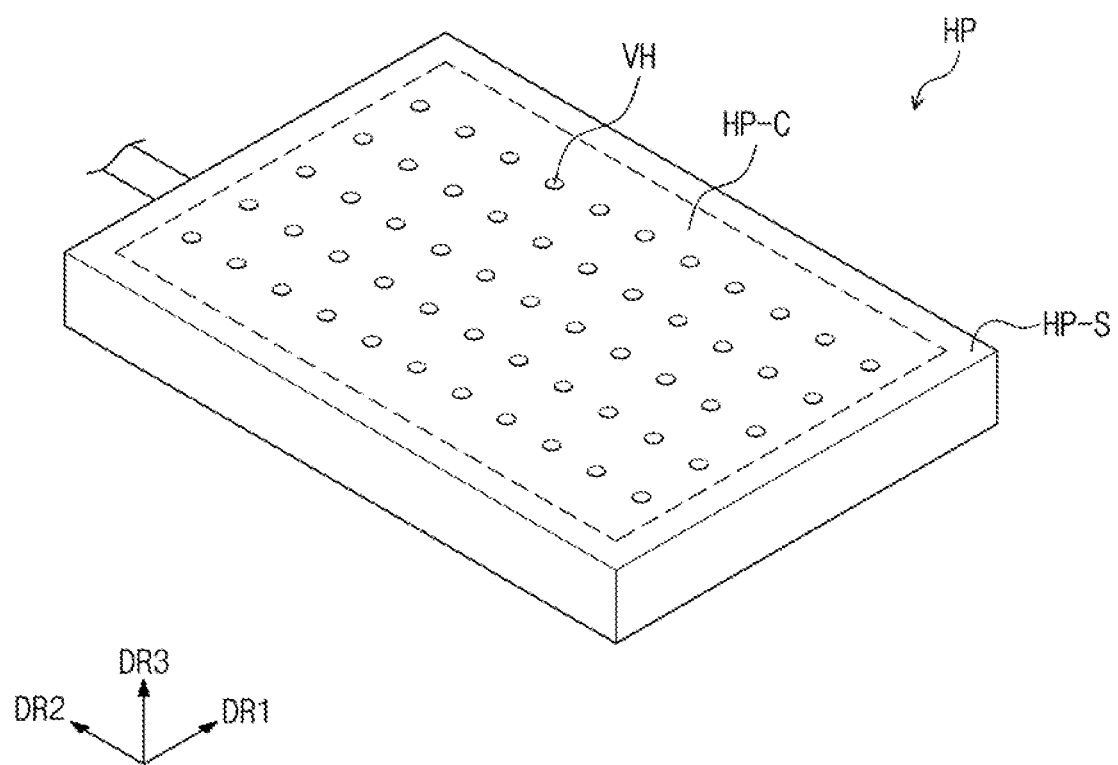
FIG. 10 is a perspective view of a heating plate of an apparatus for separating a window according to v.

FIG. 10 is a perspective view of a heating plate of an apparatus for separating a window according to an exemplary embodiment of the present invention.

FIG. 10 illustrates an example of the heating plate HP used in the heating unit HU according to an exemplary embodiment of the present invention. Referring to FIG. 10, the heating plate HP may include a central portion HP-C and a peripheral portion HP-S disposed in a periphery of the central portion HP-C to surround the central portion HP-C when viewed in a plan view. In an exemplary embodiment of the present invention, the central portion HP-C and the peripheral portion HP-S of the heating plate HP may be controlled (e.g., by the heat controller HD) to have temperatures different from each other. For example, the peripheral portion HP-S may be controlled to have a temperature higher than that of the central portion HP-C. For example, the apparatus RA for separating a window according to an exemplary embodiment of the present invention may include the heating plate HP by which the temperature of the peripheral portion HP-S and the temperature of the central portion HP-C are adjusted different from each other to apply heat to the edge and the central area of the display device DD placed on the heating plate HP so that the edge and the central area have temperatures different from each other.

For example, referring to the display device DD, the display device DD may include the display area DA and the non-display area NDA surrounding the peripheral of the display area DA, and the non-display area NDA may be a portion overlapping the color layer BP. When the display device DD is placed on the heating plate HP according to an exemplary embodiment of the present invention, the non-display area NDA of the display device DD may overlap the peripheral portion HP-S of the heating plate HP. When the peripheral portion HP-S and the central portion HP-C of the heating plate HP are controlled to have temperatures different from each other, the display area DA and the non-display area NDA may have temperatures different from each other. For example, a temperature of heat applied to the non-display area NDA may be higher than that of the display area DA. Thus, a degree of softening of the provided adhesive layer AP may be different on the display area DA and the non-display area NDA.

For example, in the apparatus RA for separating a window according to an exemplary embodiment of the present invention, the peripheral portion HP-S of the heating plate HP may be controlled to have a temperature greater than that of the central portion HP-C of the heating plate HP. Thus, the adhesive layer AP disposed on the edge of the display device DD including the color layer BP may increase in degree of softening to easily separate the display panel DP and the window WP from each other at the edge of the display device DD.

Figure 11A:
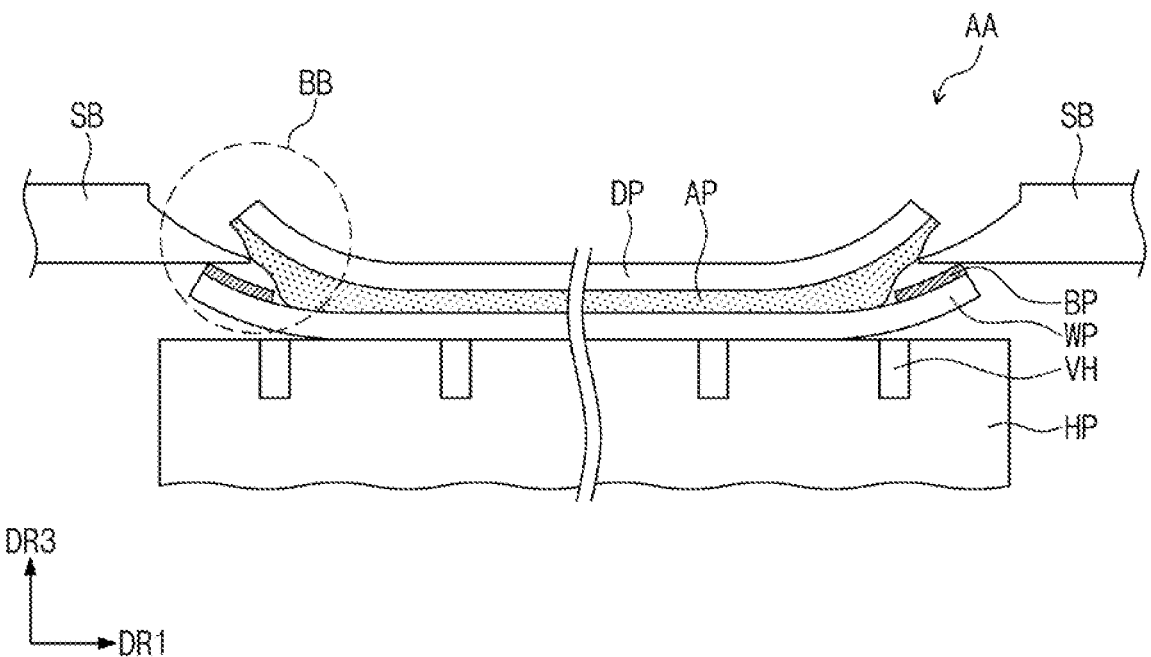
FIG. 11A is a cross-sectional view of an area AA of FIG. 5B.
Figure 11B:
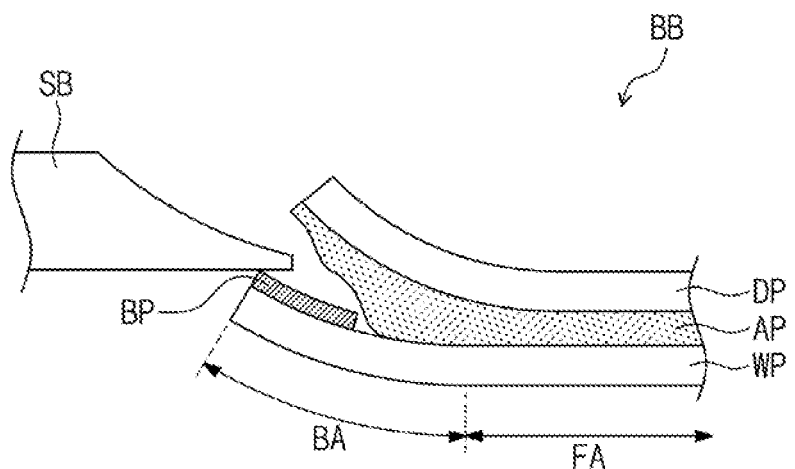
FIG. 11B is a cross-sectional view of an area BB of FIG. 11A.

FIG. 11A is a cross-sectional view of an area AA of FIG. 5B. FIG. 11B is a cross-sectional view of an area BB of FIG. 11A.

FIGS. 11A and 11B illustrate a method for separating the display panel DP and the window WP from each other by using the apparatus RA for separating the window according to an exemplary embodiment of the present invention. FIG. 11A is a detailed cross-sectional view of an area "AA" of FIG. 5B, and FIG. 11B is a detailed cross-sectional view of an area "BB" of FIG. 11A.

Referring to FIGS. 11A and 11B, the disassembling stick SB may be inserted between the display panel DP and the window WP. For example, the disassembling stick SB may separate the adhesive layer AP that is reduced in adhesion force (e.g., after heating the display device DD, as described above in more detail) to separate the window WP from the display panel DP from each other at edges thereof. The disassembling stick SB may be inserted up to a portion, at which the color layer BP is disposed, between the window WP and the display panel DP. Referring to FIGS. 11A and 11B, the disassembling stick SB may separate the window WP and the adhesive layer AP from each other.

Alternatively, the disassembling stick SB may separate the adhesive layer AP and the display panel DP from each other, and thus the adhesive layer AP may remain on the window WP.

Referring again to FIGS. 5A and 5B, the disassembling unit SU of the apparatus RA for separating a window according to an exemplary embodiment of the present invention may include the disassembling stick SB, the stick support part SP supporting the disassembling stick SB, and a stick dial SD fixed to one end of the stick support part SP to finely adjust movement of the disassembling stick SB. The disassembling unit SU may include a disassembly support part SST fixing the disassembling stick SB and the stick support part SP. The disassembly support part SST may be moved in parallel to the first directional axis DR1 or the second directional axis DR2. The disassembly support part SST may be moved in parallel to the first directional axis DR1 or the second directional axis DR2 to insert the disassembling stick SB between the display panel DP and the window WP. The disassembly support part SST may be moved in parallel to the first directional axis DR1 or the second directional axis DR2 so that the disassembling stick SB is moved between the display panel DP and the window WP to separate the adhesive layer AP from at least one of the display panel DP and the window WP.

Figure 12A:
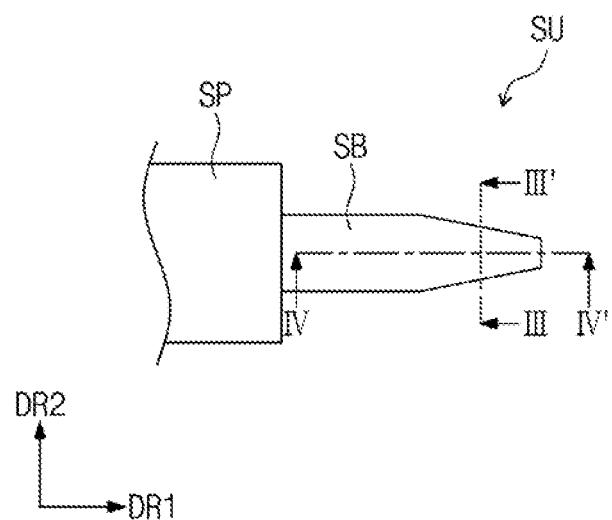
FIGS. 12A and 12B are each plan views of a disassembling stick of an apparatus for separating a window according to an exemplary embodiment of the present invention.
Figure 12B:
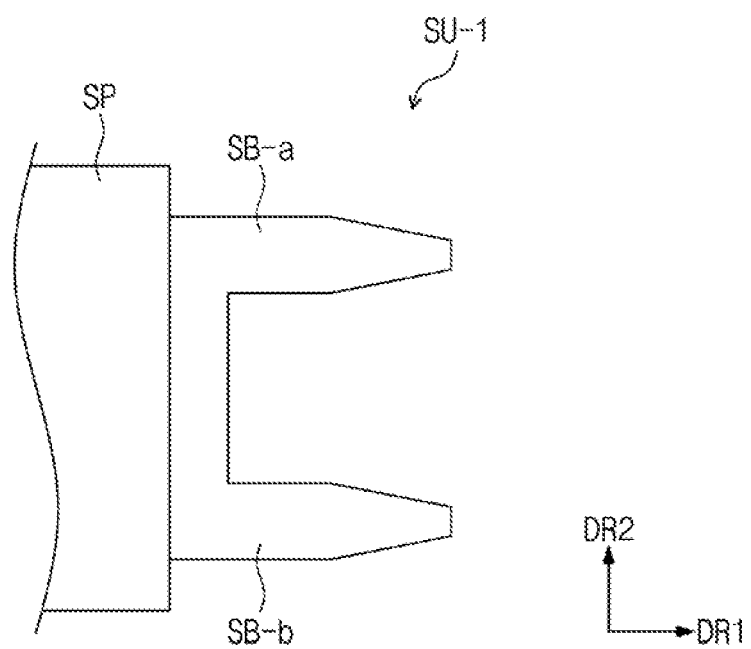
Figure 12C:
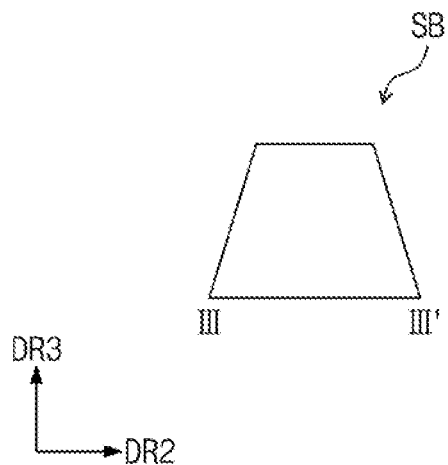
FIGS. 12C and 12D are each cross-sectional views of the disassembling stick of FIG. 12A.
Figure 12D:
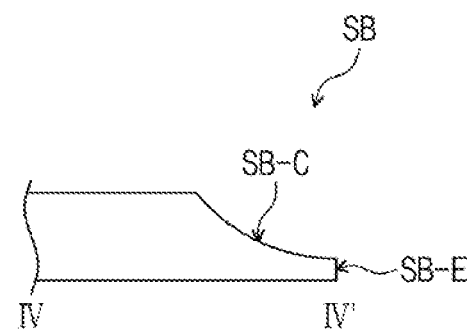

FIGS. 12A and 12B are each plan views of a disassembling stick of an apparatus for separating a window according to an exemplary embodiment of the present invention. FIGS. 12C and 12D are each cross-sectional views of the disassembling stick of FIG. 12A. The disassembling unit and the disassembling stick described with reference to FIGS. 12A to 12D are described as examples, and an apparatus for separating a window according to an exemplary embodiment of the present invention may include a disassembling stick variously designed (e.g., in consideration of a shape of the display device that is an object to be processed and separated and a disassembling unit including the same).

FIGS. 12A and 12B are plan views illustrating the disassembling unit used in the apparatus for separating the window according to an exemplary embodiment of the present invention. FIG. 12A illustrates an example of the disassembling unit SU when one disassembling stick SB is supported by the stick support part SP, and FIG. 12B illustrates an example of a disassembling unit SU-1 when a plurality of disassembling sticks SB-a and SB-b are supported by the stick support part SP.

Referring to FIGS. 12A and 12B, each of the disassembling sticks SB, SB-a, and SB-b may extend in the direction of the first directional axis DR1 on the plane defined by the first directional axis DR1 and the second directional axis DR2 and have a shape having a portion that gradually decreases in width in the extension direction.

FIG. 12C is a cross-sectional view taken along line III-III' of FIG. 12A, and FIG. 12D is a cross-sectional view taken along line IV-IV' of FIG. 12A. FIG. 12C illustrates an exemplary shape of the disassembling stick SB in a cross-section that is parallel to the plane defined by the second directional axis DR2 and the third directional axis DR3. The disassembling stick SB may have a trapezoidal shape which gradually decreases in width in the direction of the third directional axis DR3 that is a height direction of the disassembling stick SB.

FIG. 12D illustrates an exemplary shape of the disassembling stick SB in a cross-section that is parallel to the plane defined by the first directional axis DR1 and the third directional axis DR3. The disassembling stick SB may have a curved portion SB-C. The curved portion SB-C may be disposed adjacent to an edge SB-E. The curved portion SB-C may have, for example, a curvature corresponding to that of the bending area BA of the display device DD that is separated by the separating the window WP according to an exemplary embodiment of the present invention.

For example, when an apparatus for separating a window according to an exemplary embodiment of the present invention includes the disassembling stick SB having the curved portion SB-C, the curved portion SB-C of the disassembling stick SB may have a shape corresponding to that of the bending area BA to separate the window WP from the display panel DP while reducing or preventing damage of the window WP in the bending area BA.

The disassembling stick SB may include at least one of polyethylene, acetal, or nylon. For example, the disassembling stick SB may include mono cast nylon. However, exemplary embodiments of the present invention are not limited thereto. For example, the disassembling stick SB may include a polymer material having relatively low surface energy to facilitate the removal of the adhesive layer AP.

An apparatus for separating a window according to an exemplary embodiment of the present invention may be used for the processes of applying heat to a display device and inserting a disassembling stick between the display panel and the window to separate an edge of the display device in the above-described method for separating the window according to an exemplary embodiment of the present invention.

An apparatus for separating a window according to an exemplary embodiment of the present invention may be configured to heat a display device and separate an edge of the display device by using a disassembling stick. A display panel and the window may be separated first from each other at the edge of the display device to separate the window from the display panel without damaging a color layer of the window.

An exemplary embodiments of the present invention provides a method for separating a window, which includes a process of separating an edge of a display device at a relatively high temperature and a process of completely separating the window from a display panel at a relatively low temperature to separate the window from the display panel without damaging a color layer included in the window.

An exemplary embodiment of the present invention provides an apparatus for separating a window, which includes a heating unit and a disassembling unit including a disassembling stick configured to separate a window from a display panel without damaging a color layer at an edge in a state in which a display device is heated.

While the present invention has been shown and described with reference to the exemplary embodiments thereof, it will be apparent to those of ordinary skill in the art that various changes in form and detail may be made thereto without departing from the spirit and scope of the present invention.

What is claimed is:
1. A method for separating a window, the method comprising:
    providing a display device comprising a display panel, a window disposed on the display panel and comprising a color layer, and an adhesive layer disposed between the display panel and the window;
    applying heat to the display device;
    inserting a disassembling stick between the display panel and the window to separate an edge of the display panel from the window;
    cooling the display device to a temperature below the glass transition temperature of the adhesive layer; and
    separating the display panel and the window from each other, after cooling the display device.

2. The method of claim 1, wherein the color layer is disposed on an edge of the window on a bottom surface of the window adjacent to the adhesive layer.

3. The method of claim 2, wherein the color layer comprises a plurality of ink-printed layers.

4. The method of claim 2, wherein the display device comprises:
   a flat area; and
   a bending area bent from at least one side of the flat area.

5. The method of claim 4, wherein the color layer is disposed in the bending area.

6. The method of claim 1, wherein the applying heat to the display device step comprises:
   placing the display device on a heating plate; and
   heating the display device to a temperature of from about 50° C. to about 150° C.

7. The method of claim 1, wherein the disassembling stick comprises at least one of polyethylene, acetal, or mono cast nylon.

8. The method of claim 1, wherein the inserting the disassembling stick between the display panel and the window step comprises
   moving the disassembling stick to sequentially separate different edges of the display panel and the window at different sides of the display device.

9. The method of claim 1, wherein, in the inserting the disassembling stick between the display panel and the window step,
   the display panel and the window are each in direct contact with the adhesive layer in a central area of the display device, and
   the adhesive layer is separated from at least one of the display panel and the window at an edge of the display device.

10. The method of claim 1, wherein the applying, heat to the display device step and the inserting the disassembling stick between the display panel and the window step are performed at substantially a same time as each other.

11. The method of claim 1, wherein the cooling the display device step is performed at a temperature of from about −110° C. to about −60° C.

12. The method of claim 1, wherein, in the cooling the display device step,
   the display device is disposed on a cooling plate or immersed in a low-temperature bath that reduces the temperature to below a glass transition temperature of the adhesive layer.

13. The method of claim 12, wherein the low-temperature bath comprises dr ice or liquid nitrogen.

14. The method of claim 1, further comprising cleaning the window, after separating the display panel and the window from each other.

15. A method of separating a window from a display panel, comprising:
   providing a display device comprising a display panel, a window disposed on the display panel, and an adhesive layer disposed between the display panel and the window, wherein the display panel and the window have a flat central part and a curved edge part;
   substantially simultaneously applying heat to the display device, and inserting a disassembling stick between the curved edge part of the display panel and the window, wherein inserting the disassembling stick between the curved edge part of the display panel and the window separates the display panel from the window at the curved edge part;
   cooling the display device to a temperature below the glass transition temperature of the adhesive layer; and
   completely separating the window from the display panel in the cooled display device.

16. The method of claim 15, wherein a color layer disposed on the window remains disposed on the window after the window is completely separated from the display panel.

17. The method of claim 16, wherein the adhesive layer is entirely disposed on the display panel after the window is completely separated from the display panel.

* * * * *